(12) United States Patent
Pease et al.

(10) Patent No.: US 9,074,285 B2
(45) Date of Patent: Jul. 7, 2015

(54) SYSTEMS FOR DETECTING UNCONFINED-PLASMA EVENTS

(75) Inventors: John Pease, San Miguel, CA (US); Seyed Jafar Jafarian-Tehrani, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1092 days.

(21) Appl. No.: 12/101,804

(22) Filed: Apr. 11, 2008

(65) Prior Publication Data

US 2009/0151871 A1 Jun. 18, 2009

Related U.S. Application Data

(60) Provisional application No. 61/026,991, filed on Feb. 7, 2008, provisional application No. 61/013,623, filed on Dec. 13, 2007.

(51) Int. Cl.
| | |
|---|---|
| C23C 16/00 | (2006.01) |
| C23F 4/00 | (2006.01) |
| H01J 37/32 | (2006.01) |
| H05H 1/00 | (2006.01) |

(52) U.S. Cl.
CPC .............. *C23F 4/00* (2013.01); *H01J 37/32935* (2013.01); *H05H 1/0081* (2013.01)

(58) Field of Classification Search
CPC .... C23C 14/54; C23C 14/547; C23C 14/543; C23C 14/544; B05C 11/00; B05C 11/02
USPC .................................................... 156/345.24
See application file for complete search history.

(56) References Cited

U.S. PATENT DOCUMENTS

| 4,006,404 A | * | 2/1977 | Szuszczewicz et al. ...... 324/454 |
| 5,759,424 A | | 6/1998 | Imatake et al. |
| 5,851,842 A | * | 12/1998 | Katsumata et al. ............... 438/9 |

(Continued)

FOREIGN PATENT DOCUMENTS

| JP | 08-031806 A | 2/1996 |
| JP | 2002-63999 | 2/2002 |

(Continued)

OTHER PUBLICATIONS

"International Prelirninany Report on Patentability", Issued in PCT Application No. PCT/US2008/086495; Mailing Date: Jun. 24, 2010.

(Continued)

*Primary Examiner* — Keath Chen

(57) ABSTRACT

A system for detecting unconfined-plasma events in a plasma processing chamber is disclosed. The system may include a sensor disposed in the plasma processing chamber for providing a current when unconfined plasma is present in the plasma processing chamber. The system may also include a converter for converting the current into a voltage and a filter for removing noise from the voltage to provide a first signal. The system may also include a detector for determining presence of the unconfined plasma using an amplified level of the first signal and/or the first signal. The system may also include a conductor for coupling the sensor and the converter to conduct the current from the sensor to the converter. The system may also include a shield for enclosing at least a portion of the conductor to at least reduce electromagnetic noise received by the conductor.

12 Claims, 8 Drawing Sheets

(56) References Cited

U.S. PATENT DOCUMENTS

| | | | |
|---|---|---|---|
| 5,907,820 A * | 5/1999 | Pan | 702/155 |
| 5,928,528 A | 7/1999 | Kubota et al. | |
| 6,092,027 A * | 7/2000 | Takai et al. | 702/38 |
| 6,416,889 B2 * | 7/2002 | Aihara et al. | 428/696 |
| 7,072,427 B2 * | 7/2006 | Rawlins et al. | 375/346 |
| 2002/0025388 A1 * | 2/2002 | Bhardwaj et al. | 427/569 |
| 2003/0007910 A1 * | 1/2003 | Diamant Lazarovich et al. | 422/186.18 |
| 2003/0080755 A1 * | 5/2003 | Kobayashi | 324/658 |
| 2004/0223346 A1 * | 11/2004 | Rayner et al. | 363/37 |
| 2006/0249729 A1 * | 11/2006 | Mundt et al. | 257/48 |
| 2006/0275541 A1 * | 12/2006 | Weimer | 427/96.1 |
| 2007/0052454 A1 * | 3/2007 | Gose et al. | 327/108 |
| 2007/0132507 A1 * | 6/2007 | Gatta et al. | 327/552 |
| 2007/0215044 A1 * | 9/2007 | Yamazawa | 118/665 |
| 2009/0151871 A1 | 6/2009 | Pease et al. | |
| 2011/0128017 A1 | 6/2011 | Booth et al. | |

FOREIGN PATENT DOCUMENTS

| | | |
|---|---|---|
| JP | 2002082714 A | 3/2002 |
| JP | 2003217897 A | 7/2003 |
| JP | 2003273088 A | 9/2003 |
| JP | 2004-335594 A | 11/2004 |
| JP | 2006-294658 A | 10/2006 |
| KR | 10-2005-0089995 A | 9/2005 |
| KR | 10-2006-006112 A | 6/2006 |
| WO | WO2008/002938 | 1/2008 |
| WO | WO2009/076568 | 6/2009 |

OTHER PUBLICATIONS

"International Search Report", Issued in PCT Application No. PCT/US2009/033406; Mailing Date: Sep. 17, 2009.

"Written Opinion", Issued in PCT Application No. PCT/US2009/033408; Mailing Date: Sep. 17, 2009.

"International Search Report", Issued in PCT Application No. PCT/US2008/086495; Mailing Date: Jun. 24, 2009.

"Written Opinion", Issued in PCT Application No. PCT/US2008/086495; Mailing Date: Jun. 24, 2009.

"International Preliminary Report on Patentability", issued in PCT Application No. PCT/US2009/0334108; Mailing Date: Aug. 19, 2010.

Office Action (Jan. 29, 2013).

* cited by examiner though the substrate is being processed. However, continuous usage may result in exposing the unprotected electrodes of the Langmuir-style probes to the mixture of chemical species that is usually present in the chamber during plasma processing. The mixture of chemical species, which includes chemicals supplied for processing of the substrate, new chemical species generated within the processing plasma, and chemical byproducts formed during the processing of the substrate, typically includes both corrosive components and depositing

SYSTEMS FOR DETECTING UNCONFINED-PLASMA EVENTS

RELATED APPLICATIONS

The present invention claims priority under 35 USC 119(e) to a commonly owned provisionally filed patent application entitled "SYSTEMS FOR DETECTING UNCONFINED-PLASMA EVENTS," U.S. Application No. 61/026,991, filed Feb. 7, 2008 by inventors John Pease and Seyed Jafar Jafarian-Tehrani, which is incorporated herein by reference; and a commonly owned provisionally filed patent application entitled "PLASMA UNCONFINEMENT SENSOR," U.S. Application No. 61/013,623, filed Dec. 13, 2007 by inventors Jean-Paul Booth, Alexei Marakhtanov, Rajinder Dhindsa, Luc Albarede, and Seyed Jafar Jafarian-Tehrani, which is incorporated herein by reference.

BACKGROUND OF THE INVENTION

Plasma processing systems have long been employed to process substrates (such as semiconductor wafers) to produce integrated circuits. Plasma may be generated in various plasma processing systems, such as electron-cyclotron-resonance (ECR) plasma processing systems, inductively-coupled (ICP) plasma processing systems, or capacitive coupled (CCP) plasma processing systems. In many cases, confining the plasma to a specific region within the processing chamber of a plasma processing system, such as within the region directly above the substrate being processed, may provide certain advantages.

To facilitate discussion, FIG. 1 shows an example of a plasma chamber 100 in which plasma is confined during processing. Consider the situation wherein, for example, a substrate 124 is placed on an electrode 110, which is mounted to a pedestal 120, which is connected to a chamber 102. Electrode 110 is connected to a remote power supply 114, such as a radio frequency (RF) power generator, through the interior of pedestal 120. A processing gas 150, which may be a mixture of chemicals, may be introduced into chamber 102 through an inlet 104 when the pressure in chamber 102, which may be lowered by a pump (not shown), has reached a desired level. To process substrate 124, electrode 110 may capacitively couple the power from power supply 114 with processing gas 150 to form plasma 106. Usually, plasma 106 is contained within a desired region of chamber 102 by a set of confinement rings 108. During substrate processing, gases from plasma 106, which may include a mixture of chemical components from processing gas 150, chemical components formed by reactions within plasma 106, and chemical byproducts from the processing of substrate 124, may flow through confinement rings 108 and a non-plasma chamber volume 128 before being removed from chamber 102 through an outlet 126. This route is illustrated by a path 136 and usually causes the interior of chamber 102 to be exposed to highly reactive gases even when plasma 106 is contained.

However, during the processing of substrate 124, plasma 106 may unexpectedly or uncontrollably migrate out of the containment region within chamber 102. In other words, an unconfined plasma 138 may form in a region of chamber 102 that is outside of confinement rings 108. The formation of unconfined plasma 138 is undesirable because unconfined plasma 138 may alter the quality of processing plasma 106 in a way that may cause at least one of the following to occur: significantly degrading the performance on substrate 124, damaging chamber 102, and damaging the pedestal 120 or its subsystems. For example, substrate 124 may become damaged due to a change in an etch or deposition rate and/or may be damaged by being contaminated with particulate defects or elemental contamination generated by unconfined plasma 138. The processing chamber 102 and/or the pedestal 120 may be physically damaged by, for example, erosion or corrosion of chamber materials as a result of exposure to unconfined plasma 138. In addition, components of processing chamber 102 may experience electrical damage because unconfined plasma 138 may change the path by which plasma power is returned to ground through the chamber. In an example, the plasma power from power supply 114 may return to ground through chamber components that may not be designed to carry plasma power.

As can be appreciated from the foregoing, unconfined-plasma events may be caused by many different factors. For example, a plasma may become unconfined if the plasma becomes unstable. In another example, an unconfined-plasma event may occur if electrical arcing occurs within the processing chamber. In yet another example, a plasma may become unconfined if processing parameters, such as plasma power, plasma composition, gas supply flows, operating pressure, and the like, fluctuate.

Also, the occurrence of the unconfined-plasma events may be sporadic and may tend to be unpredictable. One reason for the unpredictability is that the unconfined plasma may have different forms. In addition, the specific effects that an unconfined-plasma event may have on substrate processing generally cannot be anticipated due to the variable and unpredictable forms exhibited by unconfined plasma. For example, an unconfined plasma may have low density or high density. In another example, the space occupied by the unconfined plasma may be large or small. In yet another example, an unconfined plasma may be a stable plasma or may be a fluctuating, sporadic plasma. Even the location of the unconfined plasma within the chamber may change during processing.

Various methods have been employed to detect unconfined-plasma events. One method includes utilizing an electrostatic probe that usually has multiple electrodes, such as a VI probe or a Langmuir probe to detect an unconfined-plasma event. In an example, a Langmuir-style probe, which may have unprotected electrodes (usually made from metal), may be exposed to the chamber environment. The Langmuir-style probe is typically electrically biased such that when the probe is exposed to plasma, a direct current (DC) can flow from the plasma to the probe's electrode. For example, a Langmuir-style probe 122 is positioned within the plasma environment that is outside of the desired plasma confinement region. By employing a current detector 148, DC current changes on Langmuir-style probe 122 via a power supply 118 may be detected. Also, a DC power supply (not shown) may be employed to bias the probe.

However, the operational requirements of Langmuir-style probes (i.e., that the electrodes are unprotected and that a DC electrical contact with the plasma exists) limit the utility of the Langmuir-style probes in detecting unconfined-plasma events. Also, due to the unpredictable nature of the unconfined-plasma events, the Langmuir-style probes may have to be operating continuously while the substrate is being processed in order to be effective. However, continuous usage may result in exposing the unprotected electrodes of the Langmuir-style probes to the mixture of chemical species that is usually present in the chamber during plasma processing. The mixture of chemical species, which includes chemicals supplied for processing of the substrate, new chemical species generated within the processing plasma, and chemical byproducts formed during the processing of the substrate, typically includes both corrosive components and depositing components that may detrimentally affect the ability of Langmuir-style probes to function properly.

In an example, corrosive components (e.g., chlorine, fluorine, and bromine, etc.) may cause the Langmuir-style probe to function improperly, such as failing to timely and/or accurately detect an unconfined-plasma event. In addition, corroded electrodes may become a source of particulate defects and/or metallic contamination that may indirectly damage the substrate being processed. In another example, the depositing components of the mixture (e.g., inorganic SiOx-based byproducts and organic CFx-based polymerizers) may result in the formation of an electrically-insulating film on the electrodes of the probe; thus, the film may interfere with the required plasma-electrode DC contact, thereby preventing the probe from accurately and/or timely sensing the presence of a plasma. As can be appreciated from the foregoing, the Langmuir-style probes may not be ideal for detecting unconfined-plasma events.

Another method that has been employed is to identify the changes in the bias voltage of a substrate during processing to detect unconfined-plasma events. With reference to FIG. 1, a bias voltage on substrate 124 may be produced when power provided by power supply 114 interacts with plasma 106 within chamber 100. Typically a sensor 140 may be installed (e.g., in electrode 110) to allow direct measurement of the bias voltage on substrate 124 during processing, and a bias voltage detector 144 may be employed to compare the bias voltage against a threshold. Thus, when the characteristic of plasma 106 is altered due to an unconfined plasma 138, sensor 140 may be employed to measure the bias voltage, and bias voltage detector 144 may be employed to detect the changes in the bias voltage.

Additionally or alternatively, a change in the bias voltage may be indirectly detected by measuring changes in parameters that are related to the substrate bias voltage. For example, when the substrate bias voltage changes because of unconfined plasma 138, the power supplied by a power supply 114 to an electrode 110 to maintain plasma 106 may also change. Therefore, monitoring the power supplied to plasma 106 with a RF power detector 142 may allow detection of unconfined-plasma events.

However, the utility of monitoring the bias voltage to detect unconfined-plasma events is limited by the difficulty in detecting changes in the bias voltage caused by unconfined-plasma events. Detecting changes in bias voltage is particularly difficult when higher frequency generators (such as 60 MHz) are utilized to generate plasma. The bias voltage generated by higher frequency generators is small; and since unconfined-plasma events usually occur at lower power levels, detecting the unconfined-plasma event from the small changes in the DC bias signal may be difficult or impossible. Therefore the utility of this technique is limited because of the inability to reliably detect unconfined-plasma events.

In yet another prior art approach, an optical sensor may be used to detect unconfined-plasma events. Those skilled in the art are aware that plasma generally emits light. Thus, an optical sensor may be employed to detect the light emitted from an unconfined plasma. In an example, with reference to FIG. 1, an optical sensor 132 may be installed adjacent to a transparent window 130 with a line-of-sight into an area of chamber 102 in which monitoring is desired (denoted here as a passage 134). Thus, when plasma 106 becomes unconfined, light from unconfined plasma 138 may enter passage 134 and may pass through window 130 to be detected by optical sensor 132. Upon detecting the light, optical sensor 132 may send a signal to an optical signal detector 146. If the signal is above a pre-defined threshold, optical signal detector 146 may provide an alert indicating that unconfined plasma 138 has been detected.

However, employing the optical sensor to detect unconfined-plasma events may be unsatisfactory in some cases because detecting the light emitted from unconfined plasma 138 may be difficult. This is because the light emitted by unconfined plasma 138 is significantly dimmer than the light emitted from processing plasma 106. In addition, the positioning of the optical sensor outside of the chamber may make "seeing" the light difficult through the transparent window since the reactive chemicals may cause the transparent window to be less than transparent. In other words, the reactive chemicals may cause a layer of films to be deposited on the transparent window, thereby significantly reducing the amount and/or quality of light that is detected by the optical sensor. Furthermore, the utility of optical sensors is dependent upon having viewing access into the processing environment. However, placing windows and/or viewing passages in all locations that may have to be monitored may not always be feasible.

SUMMARY OF THE INVENTION

The invention relates, in an embodiment, to an arrangement within a plasma processing environment of a plasma chamber for detecting an unconfined-plasma event. The arrangement includes a sensor, which is implemented within the plasma chamber and outside of a plasma confinement region. The sensor may produce a transient current during an unconfined-plasma event. The arrangement also includes an insulator to electrically isolate the sensor from the plasma chamber wall. The arrangement further includes a conducting contact to electrically connect a cable, wire, or conductor to the sensor through the insulator. The arrangement also includes a detection circuit, which is electrically connected to the sensor via a conductor that is attached to the conducting contact. The detection circuit is configured to convert the transient current into a transient voltage signal and to remove noise from the transient voltage signal before determining whether the transient voltage signal is above a threshold, which defines when the unconfined-plasma event is occurring. The arrangement also includes a shield for enclosing at least a portion of the conductor to at least reduce electromagnetic noise (e.g., RF noise) received by the conductor.

The above summary relates to only one or more of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
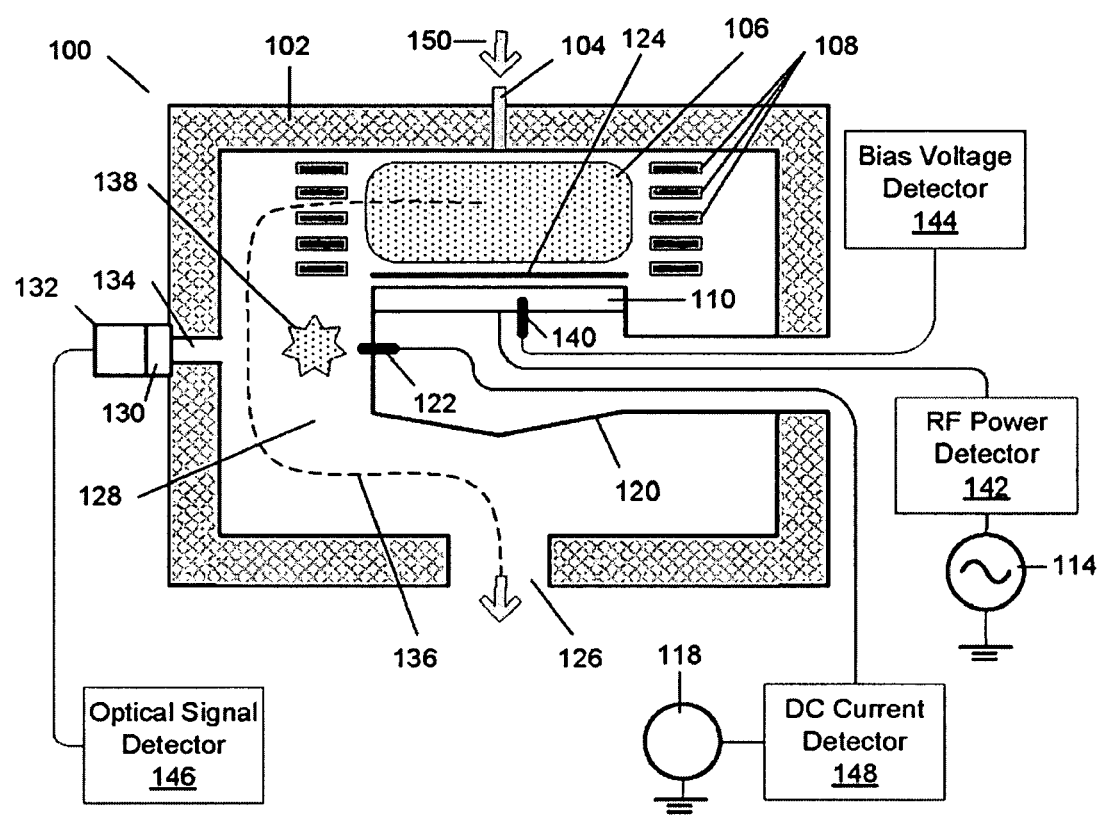
FIG. 1 shows an example of a prior art plasma processing chamber in which the plasma is confined during processing, and illustrates current strategies for detecting unconfined plasma events.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that include a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, during plasma processing, the quality of the devices being created may rely on plasma being confined within a specific region of the plasma chamber, such as within the region directly above the substrate being processed. However, plasma may become unconfined and migrate outside of the desired processing region. The formation of an unconfined plasma in a plasma chamber is highly undesirable since the quality of the processing plasma may be altered, thereby causing performance issues (e.g., significantly degrading the performance on the substrate) and/or damaging hardware (e.g., damaging the process chamber or the pedestal). The prior art methods of detecting the unconfined plasma are limited due to various reasons, including but are not limited to, the corrosion of critical sensor components and/or the deposition of an electrically insulating film on critical sensor components, and poor signal-to-noise characteristics.

Some embodiments of the present invention relate to systems for detecting unconfined-plasma events. For example, a detection system according to one or more embodiments of the invention may include an unconfined-plasma sensor, such as a capacitive-based sensor. The unconfined-plasma sensor is not sensitive to or substantially unaffected by the typically corrosive and depositing plasma processing environment. The unconfined-plasma sensor is also configured to be operated continuously during plasma processing without experiencing reduced device yield. Further, the unconfined-plasma sensor is configured to generate a clear and robust signal when an unconfined-plasma event occurs. In addition, the unconfined-plasma sensor is configured to be flexibly located within the process chamber.

The detection system may also include a detection circuit to convert a current signal received from the unconfined-plasma sensor into a voltage signal and reject noise in the signal. The detection circuit may include a resistor-capacitor (RC) filter, which may include several cascaded filtering stages for filtering noise of a wide range of frequencies. The RC filter may have a simple structure without requiring buffering arrangements being implemented between the filtering stages. Advantageously, with minimum design, manufacturing, and maintenance costs, the RC filter may effectively reject noise to provide high-fidelity signals for determining presence of unconfined plasma.

The detection system may also include a shield for enclosing at least a portion of the conductor that couples the unconfined-plasma sensor and the detection circuit. Advantageously, electromagnetic noise received by the conductor may be substantially reduced or prevented, and the current signal provided by unconfined-plasma sensor may be transmitted with minimum interference and contamination.

The detection system may also include a self-test mechanism for performing tests on the detection circuit (and the circuit of the unconfined-plasma sensor) to ensure accurate detection of unconfined plasma. The self-test mechanism may perform the tests without interrupting the operation of the plasma processing system in which the detection system is implemented. Advantageously, unconfined plasma may be accurately detected without manufacturing productivity being compromised.

Some embodiments of the present invention relate to plasma processing systems equipped with detection systems for detecting unconfined-plasma events.

The features and advantages of the present invention may be better understood with reference to the figures and discussions that follow.

Figure 2:
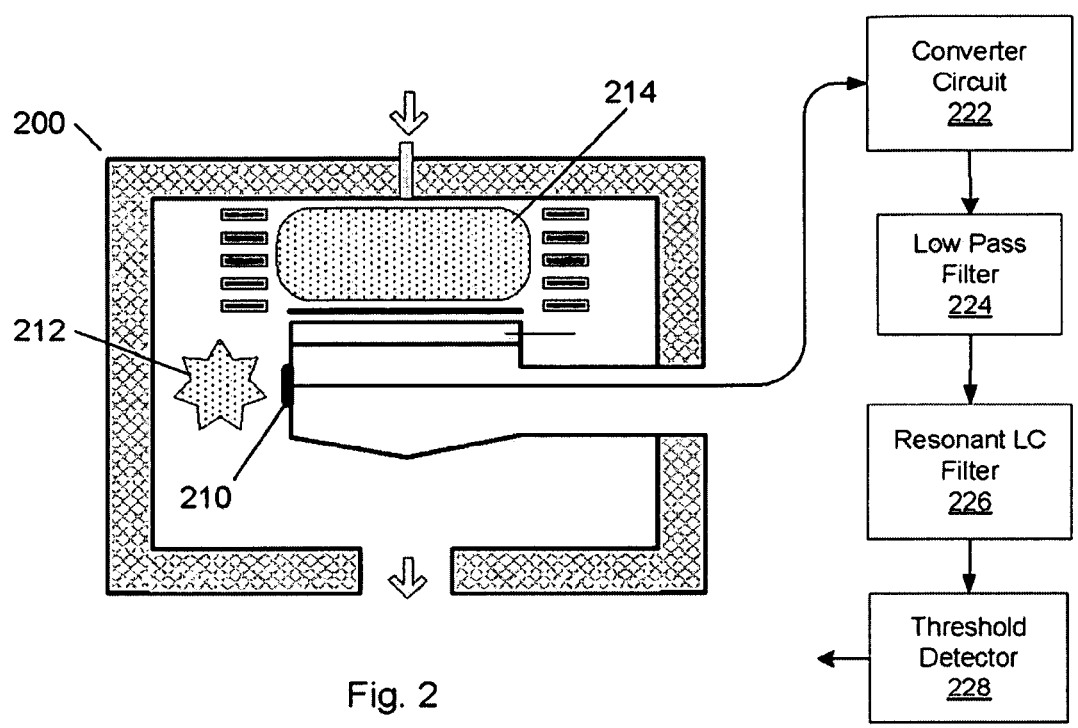
FIG. 2 shows a schematic representation illustrating a plasma chamber during plasma processing in accordance with one or more embodiments of the present invention.

FIG. 2 shows, in accordance with an embodiment of the present invention, a simple schematic of a plasma chamber 200 during plasma processing. Plasma chamber 200 may include an electrode 210 (e.g., capacitive-based sensor), which is configured to be implemented within a region in which detection of unconfined-plasma events is desired. In other words, the region may be outside of a plasma confinement region 214. In an example, electrode 210 may be mounted in a manner that enables the outer surface of electrode 210 to be exposed to unconfined plasma, such as unconfined plasma 212.

Due to the inherent characteristic of plasma, surfaces exposed to a plasma may develop an electrical charge as a result of the difference in velocities of the lighter plasma components (e.g., electrons) interacting with the heavier plasma components (e.g., molecular ions). Thus, when electrode 210 is exposed to unconfined plasma 212, the outer surface of electrode 210 may undergo a charging process. The outer electrode 210 surface may charge negatively or positively, depending on the particular characteristics of unconfined plasma 212. Usually, the charging process is transient since the charging process may only occur until the outer surface of electrode 210 has achieved an amount of charge that is at equilibrium with unconfined plasma 212.

While the transient charging process of the outer surface is occurring, a transient charge of opposite sign may be induced within electrode 210. The transient charge may be converted into a transient voltage signal by a conversion circuit 222. To remove the noise from the transient voltage signal, a low-pass filter 224 may be utilized. In an example, the transient voltage signal may be improved by passing through low-pass filter 224 to remove high-frequency components (i.e., high-frequency noise). In an embodiment, a set of resonant LC filter 226 may be employed to block specific frequencies, such as those typically used to generate plasma in order to further refine the transient voltage signal into a conditioned signal. The conditioned signal may then be forwarded to a threshold detector 228, which may be configured to compare the conditioned signal against a pre-defined threshold. If the conditioned signal is above the pre-defined threshold, threshold detector 228 may generate an alert indicating that unconfined plasma has been detected, thereby enabling appropriate actions to be taken (e.g., the plasma may be turned off and processing of the substrate stopped).

Figure 3A:
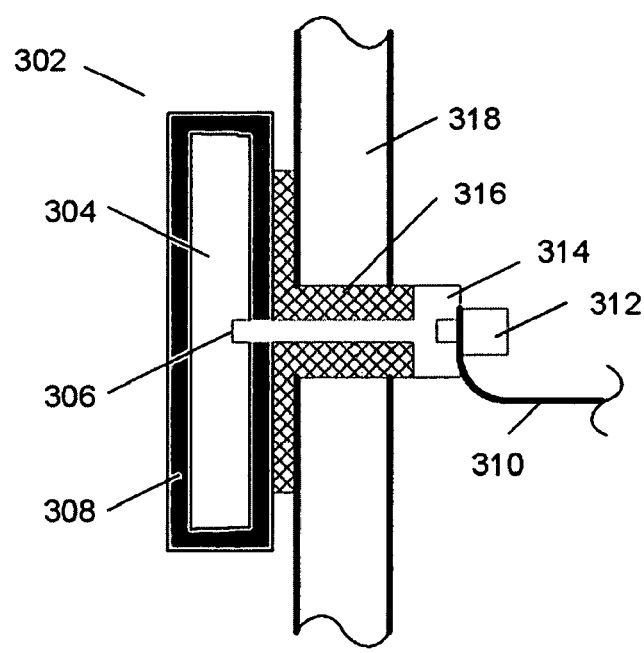
FIG. 3A shows a schematic representation illustrating an implementation of a capacitive-based sensor in accordance with one or more embodiments of the present invention.

FIG. 3A shows, in an embodiment of the invention, an implementation of the capacitive-based sensor. As mentioned in FIG. 2, a capacitive-based sensor 302 may be physically mounted on a chamber wall 318 of a plasma chamber. In an embodiment, capacitive-based sensor 302 may include at least two components: an electrically insulative outer layer 308 and an electrically conducting substrate 304. In an embodiment, capacitive-based sensor 302 is electrically isolated from the mounting surface via an insulator 316. When a transient charge is generated due to an unconfined plasma, the transient current may be sent along to a conducting contact 314, which is coupled to electrically conducting substrate 304 via an electrical contact 306. The transient charge may be sent to a detection circuit (not shown) via a wire 310, which may be secured to conducting contact 314 via a clamp 312.

In an embodiment, electrically conductive substrate 304 may be made from an electrically conducting material. In an example, electrically conductive substrate 304 may be made from a metal (e.g., Al, Cu, Ag, Au, Fe-based, etc.) or a combination/alloy of metals. In another embodiment, electrically conductive substrate 304 may be made from a semiconductor material, such as highly-doped silicon, for example. In yet another embodiment, electrically conductive substrate 304 may be made from a conductive ceramic material (e.g., silicon carbide) or a combination of conductive ceramics. In yet another embodiment, electrically conductive substrate 304 may be made from a conductive polymer. In an example, the conductive polymer may be an organic polymer containing electrically conductive "fillers." In another example, the conductive polymer may be an organic polyaniline-based polymer or a mixture of a polyanyline-based polymer. In yet another embodiment, electrically conductive substrate 304 may be made from a non-conducting polymer. In yet another embodiment, electrically conductive substrate 304 may be made from an electrically conductive inorganic polymer, such as conductive silicone, for example. In yet another embodiment, electrically conductive substrate 304 may be made from a combination of any or all of the above electrically conductive materials.

In an embodiment, electrically insulative outer layer 308 may be made of an electrically-insulative material. In an example, electrically insulative outer layer 308 may be made from a form of SiO2 (e.g., quartz or glass), a ceramic (e.g., Al2O3), a commercial polymer (e.g., PTFE, polyimide, silicone, etc.), a polymer that is a byproduct of the plasma process (e.g., a CFx-based polymer), or a combination of any or all of the above.

Furthermore, electrically insulative outer layer 308 may be made of an electrically-insulating material that may be compatible with the typical mixture of chemicals and plasma being used in the plasma chamber in which the sensor is installed. In an example, anodized aluminum is a common material in a typical plasma etch chamber (such as that illustrated in FIG. 1) since anodized aluminum is relatively inert to the chemicals typically used for substrate processing. In other words, an unconfined-plasma sensor made from anodized aluminum may be compatible with the plasma process since anodized aluminum is relatively insensitive to the plasma environment and does not become a source of metal or particulate defects.

In another embodiment, electrically insulative outer layer 308 may be grown from electrically conductive substrate 304. In an example, the anodized aluminum that may characterize electrically outer layer 308 may be grown from an aluminum substrate. In another example, electrically insulative outer layer 308 may be grown from the film deposited on electrically conductive substrate 304. The film may be deposited by a plurality of common deposition techniques, including chemical vapor deposition, plasma enhanced chemical vapor deposition, sputtering, and the like. In yet another example, electrically insulative outer layer 308 may be applied onto electrically conductive substrate 304 by a plurality of common application techniques, such as thermal spraying, sintering, thermal bonding, and the like.

The thickness of electrically insulative outer layer 308 may vary depending upon the type of insulative material. In an embodiment, the thickness of electrically insulative outer layer 308 has to be sufficiently thick to electrically insulate electrically conductive substrate 304 while still enabling an appropriate capacitance to be generated when capacitive-based sensor 302 is exposed to a plasma in order to create a measurable voltage that is detectable in the detection circuit. In an embodiment, the thickness of the film may range from 10 to 100 micrometers.

Figure 3B:
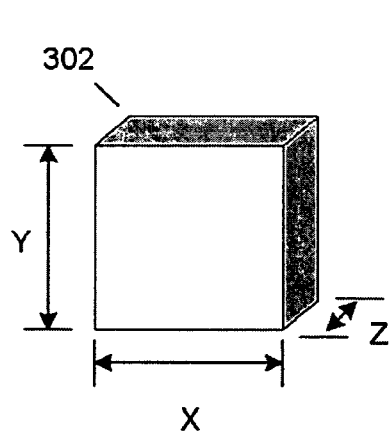
FIG. 3B shows a schematic representation illustrating a rectangular capacitive-based sensor in accordance with one or more embodiments of the present invention.
Figure 3C:
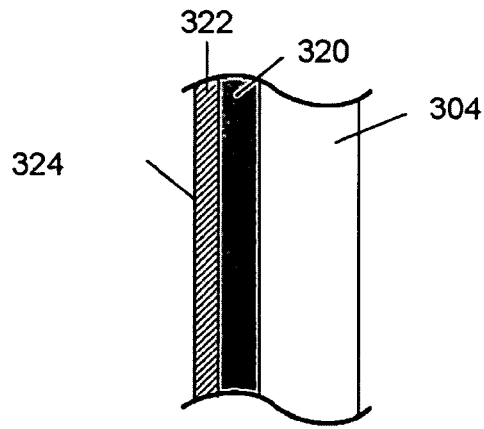
FIG. 3C shows a schematic representation illustrating a cross-section of a sensor with two electrically insulative outer layers in accordance with one or more embodiments of the present invention.

As can be appreciated from the foregoing, the number of electrically insulative outer layers that may be applied to electrically conductive substrate 304 may vary as long as the set of electrically insulative outer layers electrically isolate electrically conductive substrate 304 from the outer surface of a sensor 324, which is exposed to the unconfined plasma. To illustrate, FIG. 3C shows, in an embodiment of the invention, an example of a cross-section of a capacitive-based sensor 302 with two electrically insulative outer layers, 320 and 322. In an example, electrically insulative outer layer 322 may be applied onto electrically insulative outer layer 320 as part of the fabrication of capacitive-based sensor 302. In this example, electrically insulative outer layer 320 may become an 'intermediate glue layer' to improve the adhesion of electrically insulative outer layer 322 onto electrically conductive substrate 304. In another example, electrically insulative outer layer 320 may have a coefficient of thermal expansion that is in between that of electrically insulative outer layer 322 and that of electrically conductive substrate 304. The thermal expansion coefficient may enable capacitive-based sensor 302 to be more resistant to cracking or flaking due to the effects of thermal cycling.

In a third example, electrically insulative outer layer 322 may represent a layer of deposition that has been formed on an electrically insulative outer layer 320 due to exposure to reactive gases that are present in the processing chamber while the substrate is being processed. Because capacitive-based sensor 302 may operate like a capacitor, capacitive-based sensor 302 may be insensitive to the formation of an additional layer on the surface of the sensor. Unlike Langmuir-type probes, the formation of an electrically insulative outer layer does not eliminate the ability of the sensor to detect unconfined plasma.

Referring back to FIG. 3A, the specific combination of insulator 316, conductor contact 314, and clamp 312 may be custom-made for a particular application, or may be replaced by any number of commercial vacuum feed-through devices or components thereof.

Additionally, capacitive-based sensor 302 may be mounted to the chamber in many different ways. In an embodiment, capacitive-based sensor 302 may be mounted in close proximity to chamber wall 318, as shown in FIG. 3A. In another embodiment, capacitive-based sensor 302 may be flush with chamber wall 318. In yet another embodiment, capacitive-based sensor 302 may be mounted away (such as on the end of a rod or a pedestal) from chamber wall 318.

In an embodiment, capacitive-based sensor 302 may be formed in any geometrical shape. As can be appreciated from the foregoing, the shape of capacitive-based sensor 302 may be based on a manufacturer's preference or may be dependent upon mounting location. In an embodiment, as shown in FIG. 3B, capacitive-based sensor 302 may be a rectangular "button," with x and y dimensions of around one inch and a thickness z of about 0.05". In another embodiment, capacitive-based sensor 302 may be annular in shape, such as a ring, to account for the other components within the environment, such as a circular pedestal or a circular chamber. Usually, the sensitivity is proportional to the surface area of the probe in contact with the unconfined plasma (which may not occupy the whole exterior volume). Accordingly, a larger probe may provide a larger signal, but may also capture more noise. Furthermore, a very large probe may risk perturbing the normal plasma process, for example by changing the RF current return path. Thus, the shape and size of the sensor may depend upon a manufacturer's preference given the criteria discussed above.

As aforementioned, once the transient current has been generated, the transient current may be sent to a detection circuit to determine the existence of unconfined plasma.

Figure 4A:
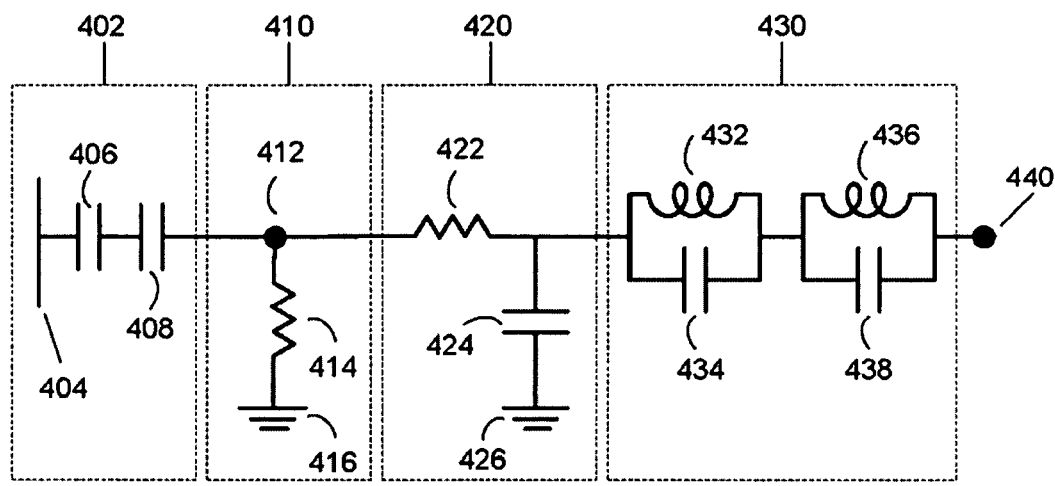
FIG. 4A shows a schematic representation illustrating circuits in an unconfined-plasma detection arrangement in accordance with one or more embodiments of the present invention.

FIG. 4A shows, in an embodiment of the invention, an example electrical model of both a capacitive-based sensor and a detector circuit. A box 402 shows an example circuit model for a capacitive-based sensor. The outer surface of the capacitive-based sensor (the surface which is exposed to a plasma) is represented by a plate 404. Capacitors 406 and 408 each represents an electrically insulative outer layer that may be present on the electrically conductive substrate of the capacitive-based sensor. As can be appreciated from the foregoing, additional layers on the electrically conductive substrate may be represented by additional capacitances in the electrical model (and vice versa). In an embodiment, the capacitance of the set of electrically insulative outer layers on the electrically conductive substrate is the dominant capacitance. In other words, the additional capacitance due to the formation of layers of plasma deposition products may be large relative to the capacitance of the outer layers of the detector, since the smallest capacitors in a series is the dominant one. Usually, a typical capacitance value of the film may be about 0.1 nano farad (nF) per square centimeter of the surface area.

Boxes 410, 420, and 430 together show an example circuit model for a detection circuit. Box 410 shows an example of a model for a current-to-voltage converter (i.e., circuit converter). The current-to-voltage converter is configured to convert the transient current generated from an electrical charge due to exposure of the plate 404 to plasma to a transient voltage. In an example, the transient current that develops across capacitors 406 and 408 due to the exposure to the plasma may flow to an electrical ground 416 via a resistor 414, thereby converting the transient current into a transient voltage signal, which may be read at point 412. In an embodiment, resistor 414 may have a value of between 1-100 kilo Ohms. In one or more embodiments, an op-amp with feedback resistor may convert the transient current into a transient voltage. One or more embodiments may use a transistor with appropriate bias to convert the transient current into a transient voltage. One or more embodiments may use a transformer to convert the transient current into a transient voltage.

The transient voltage signal generated at point 412 may then be conditioned to improve signal-to-noise characteristics. In an embodiment, the transient voltage signal may pass through a low pass filter circuit, such as the example circuit shown in box 420. In an embodiment, low pass filter 420 may include; but may not be limited to a resistor 422 connected to a capacitor 424, which is connected to a ground 426. The combination of elements 422 and 424 serve to remove high-frequency components from the transient voltage signal. In an embodiment, resistor 422 may have a value of 100 Ohms and capacitor 424 may have a value of about 100 nF.

The signal-to-noise characteristics of the transient voltage signal may be further improved by passing the transient voltage signal through a set of resonant LC filters, such as the two examples presented in box 430, in an embodiment. The first LC filter may include an inductor 432 in parallel with a capacitor 434. Similarly, the second LC filter may include an inductor 436 in parallel to a capacitor 438. With the set of resonant LC filters, the transient voltage signal may be improved by selectively blocking known and/or expected frequencies. For example, if a process plasma is powered by two separate RF generators that operate at different frequencies (e.g., 13.56 MHz and 27 MHz), the transient voltage signal generated from a capacitive-based sensor exposed to plasma may include both frequencies.

Since, the magnitude of these frequencies may interfere with the detection of the transient voltage signal, the set of resonant LC filters may be employed to block the frequencies. In an example, inductor 432 in parallel with capacitor 434 may block the 13.56 MHz component, and inductor 436 in parallel with capacitor 438 may block the 27 MHz component. Typically, the types of frequencies that may be blocked may be the types of frequencies that may be commonly utilized (e.g., 2 MHz, 27 MHz and 60 MHz). However, the set of resonant LC filters are not limited to blocking just the aforementioned frequencies and may block any frequency and/or a range of frequencies (e.g., 200 kHz to 200 MHz). As can be appreciated from the foregoing, the type of frequencies that may be blocked may depend upon the user's preference.

Once the transient voltage signal has been filtered, a conditioned signal may be generated at a point 440. In an embodiment, the conditioned signal (i.e., the output from resonant LC filter box 430) may be sent to a threshold detector (not shown). The threshold detector may compare the conditioned signal to a pre-determined threshold to determine if an unconfined-plasma event has occurred.

Figure 4B:
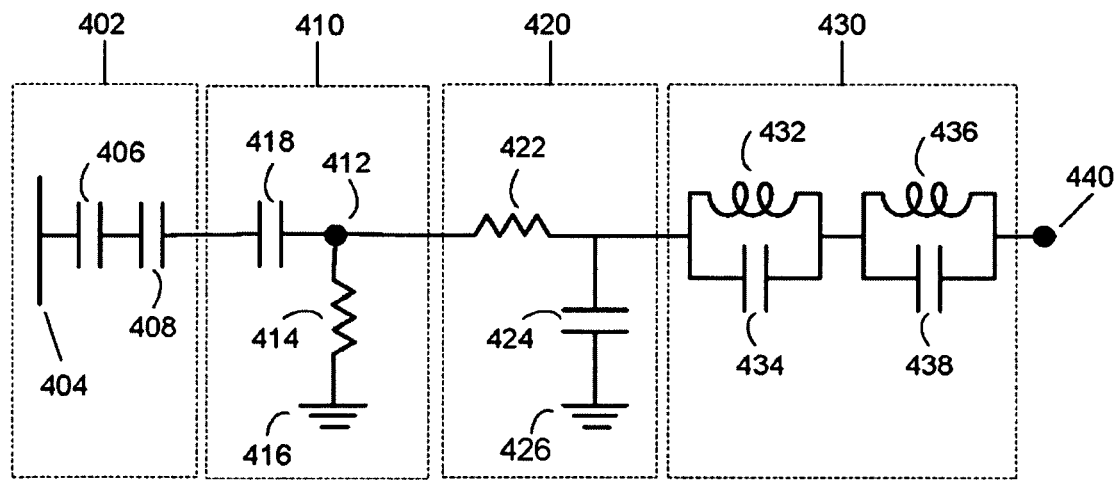
FIG. 4B shows a schematic representation illustrating circuits in an unconfined-plasma detection arrangement in accordance with one or more embodiments of the present invention.

Alternatively, the detection circuit may be implemented as shown in FIG. 4B. The detection circuit as shown in FIG. 4B is similar to the detection circuit of FIG. 4A except for the presence of an additional capacitor 418. In an embodiment, capacitor 418 may be implemented within the current-to-voltage converter of box 410. Since the capacitive-based sensor in box 402 may sometime experience short-circuit, capacitor 418 may provide some protection for the downstream components of the detection circuit (i.e., boxes 420, 430, threshold detector, etc.) from being damaged. In an embodiment, capacitor 418 may have a value of about 100 nF. As an example, if the set of outer layers of the capacitive-based sensor become damaged such that the electrically insulative characteristic of the capacitive-based sensor is compromised, model capacitors 406 and 408 in box 402 are replaced by a direct electrical connection between the capacitive-based sensor (i.e., plate 404) and the detection circuit components (which are connected to point 412 in box 410), the detection circuit may also be short-circuited and may be damaged. However, with capacitor 418, a direct connection between the plasma and the detection components may be prevented, thereby preventing the detection circuit from being damaged. In addition, even if capacitor 418 becomes exposed to the unconfined plasma due to the short-circuit situation, the transient voltage signal generated is detectably different from the transient voltage signal that is associated with a non-short-circuited sensor. As a result, the threshold detector would be able to differentiate between the two types of transient voltage signals and may even be able to make a determination that the capacitive-based sensor has been damaged.

Figure 5:
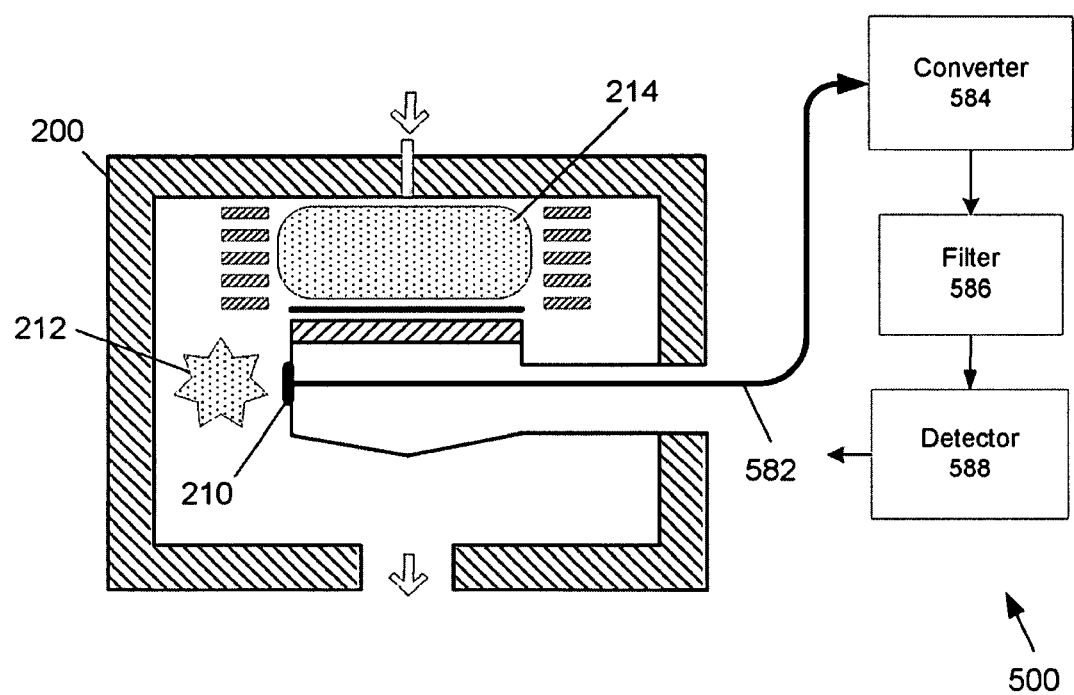
FIG. 5 shows a schematic representation illustrating a system for detecting unconfined-plasma events in a plasma processing chamber in accordance with one or more embodiments of the present invention.

FIG. 5 shows a schematic representation illustrating a system 500 for detecting unconfined-plasma events in a plasma processing chamber 200 (or plasma chamber 200) in accordance with one or more embodiments of the present invention. System 500 may provide further improvements and advantages over the embodiments discussed with reference to the examples of FIGS. 2 and 4.

For example, system 500 may be able to prevent leakage-induced errors and breakdowns, which may be potentially caused by DC voltage build-up. System 500 may also incorporate self-test functions/features to ensure accurate detection of unconfined-plasma events without comprising productivity. System 500 may also isolate sensor ground and detection ground for facilitating distinction of signal from noise (such as common mode noise). System 500 may also effectively filter noise of a wide range of frequencies with a relatively low-cost filtering mechanism. System 500 may also adjust filtering and detection mechanisms in an adaptive manner and therefore may be optimized for various configurations and recipes for plasma processing. System 500 may also facilitate studies and analyses of various unconfined-plasma events.

Similar to the embodiments discussed in the example of FIG. 2, system 500 may include a sensor 210 (or electrode 210), a converter 584, a filter 586, and a detector 588. However, in a novel and non-obvious manner, system 500 may not need a resonant LC filter as required in the examples of FIGS. 2 and 4. System 500 may also include a shielded conductor 582 (e.g., a shielded cable) configured to couple sensor 210 and converter 584. Shielded conductor 582, converter 584, filter 586, and detector 588, and associated features and advantages are further discussed with reference to the examples of FIGS. 6, 7, and 8.

Figure 6:
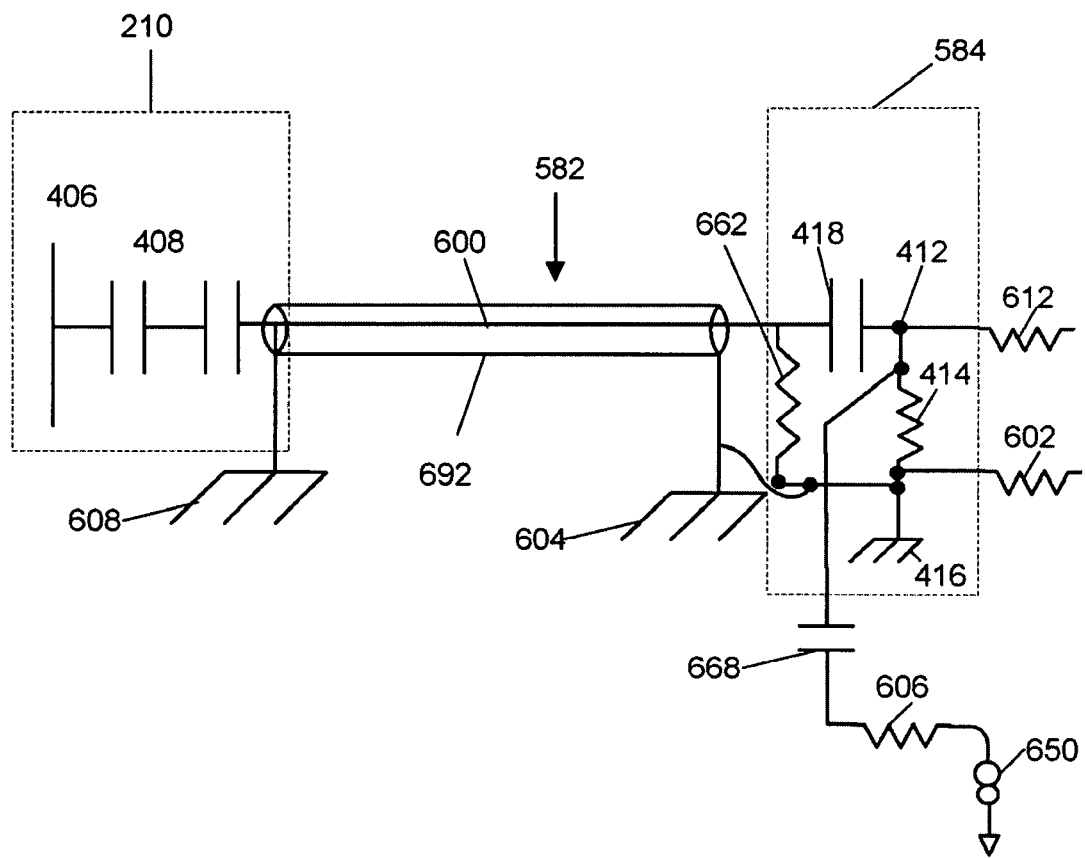
FIG. 6 shows a schematic representation illustrating a sensor, a shielded conductor, and a converter in the system illustrated in the example of FIG. 5 in accordance with one or more embodiments of the present invention.

FIG. 6 illustrates a schematic representation of sensor 210, shield conductor 582, and converter 584 in system 500 in accordance with one or more embodiments of the present invention. Among the components, sensor 210 has been discussed with reference to the example of FIG. 2.

Shielded conductor 582 may include conductor 600 for coupling sensor 210 and converter 584. Conductor 600 may have a low capacitance (or high characteristic impedance) for transmitting low frequency pulses from sensor 210 concerning unconfined plasma to converter 584. Shielded conductor 582 may also include a shield 692 enclosing at least a portion of conductor 600. Shield 692 may be electrically grounded at two ends through a ground 608 and a ground 604. Ground 608 may be located close to sensor 210 and before signals are substantially transmitted through conductor 600. Shield 692 may provide shielding for signals transmitted through conductor 600. In general, if conductor 600 is not shielded, conductor 600 may act as an antenna that may radiate and receive electromagnetic energy. As a result, the strength of desired signals may be reduced, and external signals may be received to cause interference and noise. Advantageously, shield 692 may prevent signal strength loss and may shield signals from external interference and noise.

Converter 584 may have components, such as capacitor 418, resistor 414, and ground 416, similar to components discussed in the example of FIG. 2. In addition, system 600 may include resistors 612 and 602 differentially coupled across resistor 414 for rejecting common-mode noise. Resistors 612 and 602 may also be configured for measuring voltage signals.

System 500 may also include bleeding resistor 662 for preventing DC voltage build-up, thereby preventing leakage-induced error and breakdown of converter 584. Bleeding resistor 662 may have high resistance relative to the rest of the circuit in system 500, such that bleeding resistor 662 does not unduly load down the signal to be measured. Nevertheless, the resistance of bleeding resistor 662 may be low enough to keep the DC voltage below an acceptable amount to prevent DC voltage build-up. As an example, the resistance of bleeding resistor 662 may be on the order of Mega Ohms.

System 500 may also include a self-test mechanism. For example, system 500 may include a self-test current source 650 coupled with node 412 through a series capacitor 668 and a series resistor 606. Self-test current source 650 may provide a signal, such as a self-test pulse, to node 412 to test the circuit of one or more of converter 584, filter 586, etc. Self-test current source 650 may have high impedance such that current source 650, series capacitor 668, and series resistor 606 may not unduly load down node 412. Series capacitor 668 may have capacitance on the order of nano farads (nF). The resistance of series resistor 606 may be on the order of kilo Ohms. The self-test pulse injected to node 412 may have one or more characteristics, e.g., rise time, that are consistent with a signal pertaining to an unconfined plasma. Series capacitor 668 may be a variable capacitor for adjusting the self-test pulse. In another embodiment, a buffered waveform generator with an isolating signal switch may be used to generate and inject the self-test signal into node 412.

In system 500, compound grounding may be utilized. For example, ground 604 may be connected to a frame ground through a bracket. Ground 416 may be connected to another frame ground through another bracket. In general, a frame ground is a ground point on a metal piece that forms the frame or enclosure of a machine (such as a plasma processing system). The brackets may be kept separate and/or may have high impedance in between such that the brackets do not couple with each other.

Figure 7:
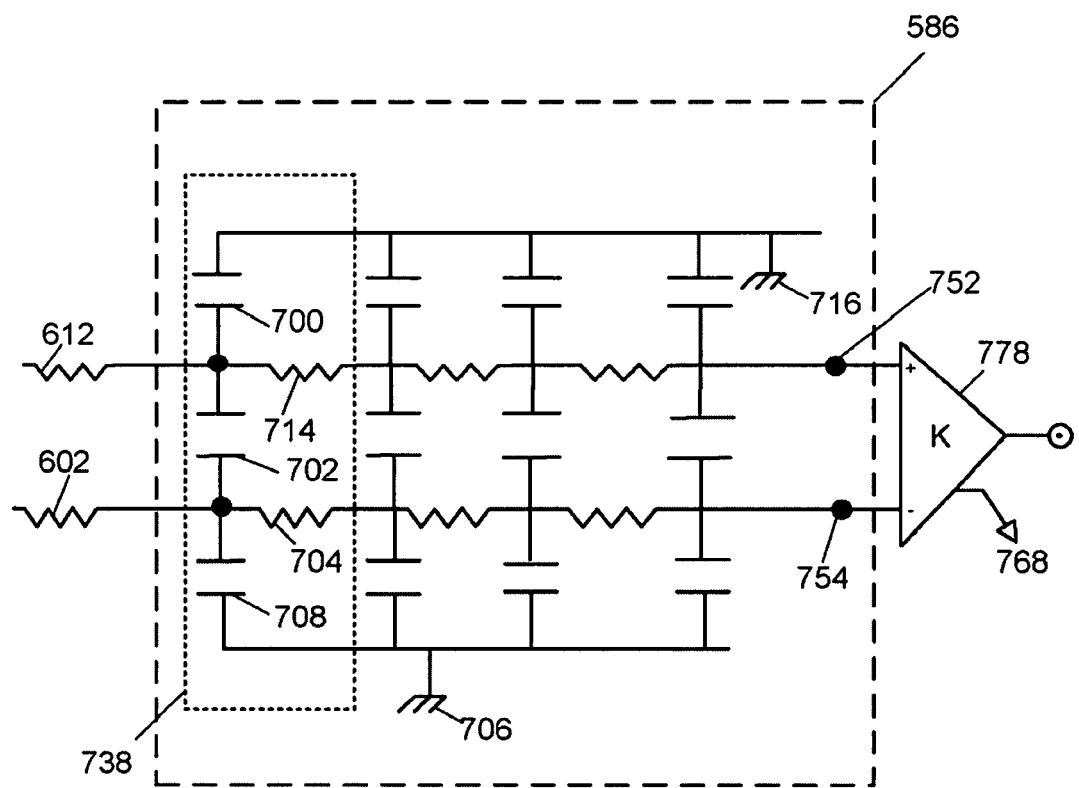
FIG. 7 shows a schematic representation illustrating a filter in the system illustrated in the example of FIG. 5 in accordance with one or more embodiments of the invention.

FIG. 7 shows a schematic representation illustrating filter 586 in system 500 in accordance with one or more embodiments of the invention. Filter 586 may be connected with converter 584 (discussed with reference to FIG. 6) through differentially coupled resistors 612 and 602, which serve as input resistors. Filter 586 may include one or more resistor-capacitor (RC) filters. The one or more RC filters may have a wide range of frequency response and therefore may be able to effectively reject noise over a wide range of frequencies.

In the example of FIG. 7, four stages of RC filters are implemented, though different numbers of stages may be utilized in various embodiments. The four stages may be cascaded and/or may work independently. The four stages of filter 586 may have similar configurations. As an example, stage 738 may include shunt capacitors 700 and 708 for shunting electromagnetic noise (e.g., RF noise) to ground 706 and ground 716, respectively. Ground 706 and ground 716 may be coupled to the same frame ground or different frame grounds. In one or more embodiments, ground 706 and 716 may be connected and may share the same grounding strap. The grounding strap for ground 706 and ground 716 may be different from the grounding strap utilized for ground 604 and ground 416 shown in the example of FIG. 6. With electromagnetic noise shunted to grounds 706 and 716, comprehensive rejection of noise may be performed, and high-fidelity signals may be provided.

Stage 738 may also include a capacitor 702. Capacitor 702 may cause a short circuit and may attenuate differential-mode RF signals received through differentially coupled resistors 612 and 602, for further improving the output signal of filter 586.

The effect of RC filtering can be modified by the number of stages. With a simple structure, excellent pulse fidelity for low frequency signals (e.g., on the order of KHz) may be sufficiently provided with substantial rejection for high frequency noise, e.g., 100 dB of noise-rejection at 400 KHz. The number of stages may determine the amount of rejection. For example, each stage may provide about 20 dB of rejection per decade.

The RC filtering circuit can be designed to provide attenuation of noise at the lowest frequency expected, e.g., the lowest frequency plasma processing chamber 200 (illustrated in the example of FIG. 5) may operate on. Accordingly, noise above the lowest expected frequency may be rejected. With RC arrangements, filter 586 does not require the selection of specific inductance and capacitance values for fundamental frequencies and harmonic frequencies. In contrast, such a selection is typically required in resonant LC filters. Further, the RC circuit in filter 586 generally is not sensitive to resonance and can be cascaded without requiring the buffering arrangements being disposed between different stages. In contrast, buffering is usually required for LC resonant filters. Accordingly, design, implementation, and maintenance costs associated with filter 586 is relative low compared with costs associated with filters utilizing LC arrangements.

Filtered signals provided by filter 586 may be received at nodes 752 and 754 as input into a differential amplifier 778. Differential amplifier 778 may have a high impedance input (e.g., on the order of Mega Ohms), which may allow the use of high-resistance resistors, such as resistors 612, 602, 714, and 704, with resistance values on the order of 100 KΩ. Differential amplifier 778 may also provide a gain to amplify the filtered signals for facilitating detection of unconfined plasma. Differential amplifier 778 may be coupled with an analog signal ground 768 to provide a reference for signal detection and for conditioning electronic components. The combination of filter 586 and differential amplifier 778 has high CMRR over a very wide frequency range. The combination also has steep roll-off to reject differential mode high frequency noise with Gaussian shape to preserve pulse fidelity.

Figure 8:
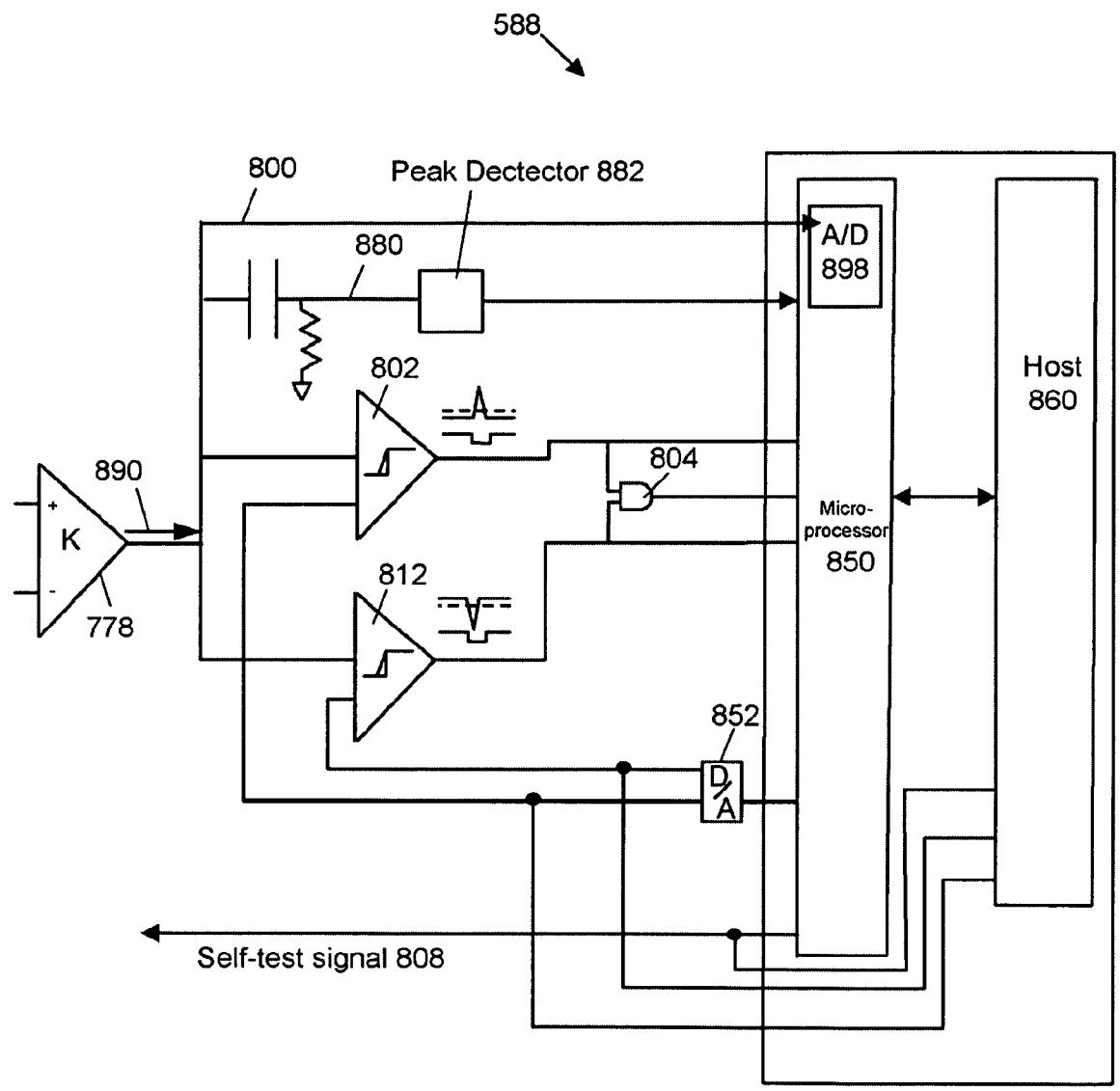
FIG. 8 shows a schematic representation illustrating a detector in the system illustrated in the example of FIG. 5 in accordance with one or more embodiments of the present invention.

FIG. 8 shows a schematic representation illustrating detector 588 in system 500 in accordance with one or more embodiments of the present invention. Detector 588 may include a microprocessor 850 for processing signals (e.g., a signal 890) provided by differential amplifier 778. Signal 890 may drive several (alternative) input signals to microprocessor 850.

For example, through connection 800, signal 890 may be provided to an analog-to-digital (A/D) converter 898 of microprocessor 850. Accordingly, A/D converter 898 may convert signal 890 into a digital signal. Processor 850 may process and/or analyze the digital signal for the detection of an unconfined-plasma event and/or for studies of unconfined-plasma events.

Through connection 880, signal 890 may be provided to a peak detector 882 for measuring the peak value(s) of the left-over high frequency noise(s). The peak values of the left-over noise may be utilized to adjust the threshold of comparators 802 and 812 in system 500. Advantageously, settings for thresholds utilized in detecting unconfined-plasma events may be optimized, and false triggers may be avoided.

Signal 890 may also be provided to at least one of positive comparator 802 and negative comparator 812 for detecting at least one of positive unconfined plasma coupling and negative unconfined plasma coupling. In one or more embodiments, both positive and negative unconfined plasma couplings may be detected. The output signals of comparators 802 and 812 may be provided to microprocessor 850 for further analyses. An AND gate 804 may be utilized to determine whether either one of the signals provided from comparators 802 and 812 is active. AND gate 804 may trigger microprocessor 850 to start a timer if at least one of the signals from comparators 802 and 812 is active. If neither of the signals is active, the timer may be stopped, and the accumulated time may be assessed for determining the width of a pulse pertaining to signal 890.

If the pulse width is greater than a predefined threshold value (which may be, e.g., on the order of 500 microseconds to 1 millisecond), unconfined plasma may be determined to be present. Accordingly, microprocessor 850 may inform a host device 860 of the presence of the unconfined plasma. Host device 860 may then perform appropriate actions in response to the presence of the unconfined plasma, such as suspending the plasma processing in plasma processing chamber 200 (illustrated in the example of FIG. 5).

If the pulse width is less than another threshold value, microprocessor 850 may determine that there is noise and may trigger a noise indication. Accordingly, system 500 may be further fine-tuned to eliminate spurious response to noise.

Various characteristics, such as magnitude, polarity, etc., of the pulse associated with signal 890 may be logged for analyses of various events by microprocessor 850.

Microprocessor 850 (or host 860) may also provide a self-test signal 808 for testing the circuitry of at least one of converter 584, filter 586, etc., without the operation of chamber 200 being interrupted or disrupted.

System 500 may also include a digital-to-analog (D/A) converter 852 for configuring thresholds for comparators 802 and 812. The thresholds may be configured in an adaptive manner in response to noise indications and/or may be configured according to user/customer requirements.

In one or more embodiments, a powerful processor may be utilized (in place of microprocessor 850) to execute digital signal processing algorithms for processing signal 890. Accordingly, peak detector 882, positive comparator 802, and negative comparator 812, etc. may not be needed.

In one or more embodiments, analog signals provided by peak detector 882, comparator 802, and/or comparator 812 may be analyzed by an analog device to determine the presence of any unconfined plasma without the need of the digital microprocessor 850.

As can be appreciated from the forgoing, one or more embodiments of the present invention provide for an unconfined-plasma sensor for detecting unconfined plasma. By having a set of electrically insulative outer layers protecting the conductive substrate of the unconfined-plasma sensor, the unconfined-plasma sensor is protected from the plasma environment, thereby enabling the unconfined-plasma sensor to perform without suffering a performance decline due to corrosion of critical sensor components and/or deposition of electrically insulating films on the conducting substrate of the sensor. With a detection circuit capable of filtering out extraneous noise from the voltage signal, the voltage signal may be of higher quality; thus, providing the threshold detector with a clear signal from which an unconfined-plasma event may be determined. Accordingly, appropriate actions may be taken in response to unconfined-plasma events. Advantageously, damage to wafers and plasma processing equipment potentially caused by repeated unconfined-plasma events may be prevented, and the processing yield may be optimized.

Some embodiments may provide further improvements and advantages concerning signal fidelity and equipment protection, with reduced costs. For example, embodiments of the invention may shield the signal transmission path to maintain signal strength and to minimize effects of external noise. Embodiments of the invention may minimize DC voltage build-up, thereby reducing/preventing leakage-induced errors and component damage. Embodiments of the invention may also utilize simple RC filter implementation that can reject noise over a wide range of frequencies. Advantageously, the implementation and maintenance costs for the detection system may be minimized, and, with noise effectively filtered, accuracy for detecting unconfined-plasma events may be maximized.

Embodiments of the invention may also provide self-test features to facilitate troubleshooting of unconfined-plasma detection systems without interrupting the wafer fabrication process. Advantageously, wafer fabrication processes may be optimized against unconfined-plasma events without compromising productivity.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A system for detecting unconfined-plasma events in a plasma processing chamber, the system comprising:
a capacitive sensor comprising:
a conductive plate that is arranged a predetermined distance from a conducting surface of the plasma processing chamber,
wherein the conductive plate includes an outer planar surface facing an interior of the plasma processing chamber and an inner planar surface arranged parallel to the conducting surface of the plasma processing chamber;
a first insulating layer arranged around and in direct contact with the conductive plate;
a second insulating layer that is arranged between and in direct contact with the first insulating layer and in direct contact with the conducting surface of the plasma processing chamber; and
a conductor configured to provide a connection though a bore in the conducting surface of the plasma processing chamber, the first insulating layer and the second insulating layer to the conductive plate,
wherein the second insulating layer extends though the bore in the conducting surface of the plasma processing chamber and insulates the conductor from the bore in the conducting surface of the plasma processing chamber, and
wherein the capacitive sensor is not biased by a power supply during a normal operating mode;
a converter connected to the conductor and configured to convert current, that is output by the capacitive sensor and that is generated due to charging of the capacitive sensor during the unconfined-plasma events, to a voltage;
a filter configured to remove noise from the voltage and to generate a first signal; and
a detector configured to detect the unconfined-plasma events in the plasma processing chamber based on the first signal.

2. The system of claim 1, further comprising:
a first resonant filter connected to the filter to filter a first frequency corresponding to a first RF plasma generator signal; and
a second resonant filter to filter a second frequency corresponding to a second RF plasma generator signal,
wherein the detector is configured to detect the unconfined plasma events in the plasma processing chamber based on an output of the second resonant filter.

3. The system of claim 1, further comprising a detector configured to detect unconfined plasma in the plasma processing chamber based on an input signal, wherein the input signal includes at least one of the first signal and an amplified signal based on the first signal.

4. The system of claim 3, further comprising:
a grounded shield configured to enclose at least a portion of the conductor.

5. The system of claim 1, further comprising a bleed resistor coupled to the conductor between the capacitive sensor and the converter.

6. The system of claim 1, wherein the converter comprises:
a first capacitor having one end connected to the conductor; and
a first resistor connected to another end of the capacitor and to ground.

7. The system of claim 6, further comprising:
a second capacitor having one end connected between the first capacitor and the first resistor;
a second resistor connected to another end of the second capacitor; and
a current source configured to supply current to the second resistor during a self-test mode that is different than the normal operating mode.

8. The system of claim 6, further comprising:
a second resistor connected between one end of the first resistor and the filter; and
a third resistor connected between another end of the first resistor and the filter,
wherein the second resistor and the third resistor output a differential signal to the filter.

9. The system of claim 8, wherein the filter comprises a multi-stage filter that generates a filtered differential signal based on the differential signal.

10. The system of claim 9, further comprising:
a differential amplifier configured to generate an amplified differential signal based on the filtered differential signal and to output the amplified differential signal to a detector.

11. The system of claim 1, wherein the conducting surface comprises a wall of the plasma processing chamber.

12. The system of claim 1, further comprising a third insulating layer formed around the first insulating layer, wherein the first insulating layer has a coefficient of thermal expansion that is between coefficients of thermal expansion of the third insulating layer and the conducting plate.

* * * * *